(12) United States Patent
Cao et al.

(10) Patent No.: US 6,498,108 B2
(45) Date of Patent: Dec. 24, 2002

(54) METHOD FOR REMOVING SURFACE CONTAMINATION ON SEMICONDUCTOR SUBSTRATES

(75) Inventors: Densen Cao, Sandy, UT (US); Becky Losee, Lehi, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/782,343

(22) Filed: Feb. 12, 2001

(65) Prior Publication Data

US 2002/0111023 A1 Aug. 15, 2002

(51) Int. Cl.$^7$ .............................................. H01L 21/302
(52) U.S. Cl. ............................ 438/706; 438/720; 134/1
(58) Field of Search ............................... 438/706, 714, 438/719, 720, 745; 134/1, 1.1

(56) References Cited

U.S. PATENT DOCUMENTS

| | | |
|---|---|---|
| 4,607,270 A | 8/1986 | Iesaka |
| 4,752,813 A | 6/1988 | Bhatia et al. |
| 5,365,102 A | 11/1994 | Mehrotra et al. |
| 5,389,570 A * | 2/1995 | Shiozawa ................ 427/248.1 |
| 5,719,084 A | 2/1998 | Mallon et al. |
| 5,741,396 A * | 4/1998 | Loewenstein ................ 216/79 |
| 5,783,493 A | 7/1998 | Yeh et al. |
| 5,897,374 A * | 4/1999 | Lin ............................ 438/666 |
| 6,051,488 A | 4/2000 | Lee et al. |
| 6,107,192 A * | 8/2000 | Subrahmanyan et al. ... 438/637 |
| 6,351,018 B1 * | 2/2002 | Sapp .......................... 257/155 |

OTHER PUBLICATIONS

Dallas Morisette, "Schottky Barrier Diodes", http://www.ecn.purdue.edu/WBG/Device_Research/Schottky_Diodes/Index.html, SiC Schottky Barrier Diode Development at Purdue.
James D. Plummer, et al., Silicon VLSI Technology, 2000, pp. 612–649.

* cited by examiner

Primary Examiner—Robert Kunemund
Assistant Examiner—Kin-Chan Chen
(74) Attorney, Agent, or Firm—Townsend and Townsend and Crew LLP

(57) ABSTRACT

A method for removing contaminants on a semiconductor substrate is disclosed. In one embodiment, the method includes forming a dielectric structure on the semiconductor substrate. A portion of an electrically conducting region to a side of the dielectric structure is etched, and a conductive material is deposited on the etched electrically conducting region.

22 Claims, 5 Drawing Sheets

METHOD FOR REMOVING SURFACE CONTAMINATION ON SEMICONDUCTOR SUBSTRATES

BACKGROUND OF THE INVENTION

Field effect transistors (FETs) are attractive as switching devices in power supplies. However, the high dv/dt stresses to which the switching devices in such power supplies are exposed can cause an internal body diode of a FET to conduct under normal power supply operating conditions. This internal body diode is a bipolar diode that stores an associated charge that can be relatively large because of the relatively large volume of the drift region in a power FET. Consequently, the recovery time of this diode after forward conduction can become a substantial portion of an operating cycle as the operating frequency is increased. The conduction in these diodes limits the maximum switching speed and contributes to power losses within the power supply.

One solution to this problem is to provide a Schottky diode in parallel with a FET. In a circuit including these elements, the body diode of the FET does not turn on if the Schottky diode has lower turn-on voltage than the turn-on voltage of the body diode. A fast reverse recovery results since Schottky diodes have very short reverse recovery times.

Reliably fabricating integrated circuits with FETs and Schottky diodes is difficult due to the formation of contaminants during processing. Contaminants formed during processing can deposit on a surface of an electrically conducting region that will form a Schottky contact. The electrically conducting region may be, for example, a semiconducting portion of a Schottky diode. If contaminants deposit on the electrically conducting layer, the conductivity at the surface of the electrically conducting region is altered. When a Schottky metal is deposited on the surface of the electrically conducting region, the formed Schottky diode may not function in its intended manner because of the altered conductivity of the electrically conducting region.

The contaminants that deposit on the electrically conducting regions can be produced at many stages of the fabrication process. For instance, contaminants may be produced during a photolithography process. Photolithography processes are used to form dielectric structures that isolate gate electrodes from source regions in FETs. In an exemplary process, a dielectric layer is first deposited on a semiconductor substrate. A layer of photoresist is then deposited on the dielectric layer and is irradiated with a pattern of radiation. The irradiated portions of the photoresist layer may be removed to form a photoresist pattern. Portions of the dielectric layer exposed through the photoresist pattern may be etched. After etching, the photoresist pattern may be stripped in a stripping chamber to leave a plurality of dielectric structures. During stripping, some of the photoresist may not be completely removed from the stripping chamber and can deposit on electrically conducting regions on the semiconductor substrate.

Contaminants can also be present in the air of a cleanroom or in processing fluids such as process gases and process liquids. Contaminants in the air or in processing fluids can also deposit on electrically conducting regions on a semiconductor substrate, thus altering the conductive properties of the electrically conducting regions.

Contaminants can also be produced in a reflow process. FIG. 1, for example, shows a semiconductor substrate 202 having a plurality of trench metal oxide field effect transistor (MOSFET) devices 200 and a plurality of electrically conducting regions 218 comprising a semiconducting material. Dielectric structures 250 made of BPSG (borophosphosilicate glass) are disposed on the semiconductor substrate 202 and isolate the gate electrodes from the source regions in the MOSFET devices 200. In this example, the electrically conducting regions 218 have an upper surface that coincides with the upper surface of the semiconductor substrate 202. The electrically conducting regions 218 are disposed to the sides of the dielectric structures 250.

During a reflow process, the dielectric structures 250 are heated to melt them. When the dielectric structures 250 are heated, dopants such as boron and phosphorous in the dielectric structures 250 vaporize and deposit on and/or diffuse into electrically conducting regions 218 on the semiconductor substrate 202. This is sometimes referred to as "autodoping". As shown by the arrows 150 in FIG. 1, in autodoping, dopants can deposit anywhere on the semiconductor substrate 202. Dopants that are at the electrically conducting regions 218 alter the surface conductivity of the electrically conducting regions 218. When a conductive material (not shown) such as a Schottky metal is deposited on the electrically conducting regions 218, a Schottky diode is formed. Because of the altered conductivity of the electrically conducting regions 218, the formed Schottky diode may not function as intended.

In sum, the presence of contaminants at electrically conducting regions on a semiconductor substrate makes reliable volume production of devices such as Schottky diodes difficult. Embodiments of the invention address these and other problems.

SUMMARY OF THE INVENTION

Embodiments of the invention relate to methods for removing contaminants from electrically conducting regions that are disposed adjacent a dielectric structure. Broadly, contaminants at the electrically conducting regions can be removed by, for example, etching a portion of the electrically conducting regions.

One embodiment of the invention is directed to a method for removing contaminants on a semiconductor substrate. The method comprises: (a) forming a dielectric structure on the semiconductor substrate; (b) etching a portion of an electrically conducting region disposed to a side of the dielectric structure, wherein the electrically conducting region is etched at a faster rate than the dielectric structure; and (c) depositing a conductive material on the etched electrically conducting region.

Another embodiment of the invention is directed to a method for removing surface contamination on a semiconductor substrate. The method comprises: (a) forming a field effect transistor on a semiconductor substrate, wherein the field effect transistor has a gate electrode, a source region, and a drain region; (b) forming a dielectric structure on the gate electrode and the source region; (c) reflowing the dielectric structure; (d) etching a portion of the electrically conducting region disposed to a side of the reflowed dielectric structure, wherein the electrically conducting region is etched at a faster rate than the dielectric structure; (e) forming a barrier layer for a Schottky diode on the etched electrically conducting region; and (f) depositing a conductive layer on the barrier layer.

Other embodiments of the invention relate to products made by such methods.

These and other embodiments of the invention are described in further detail with reference to the Figures and the detailed description.

It is understood that the figures are used to illustrate exemplary embodiments of the invention and are not intended to limit the invention. For purposes of clarity, some features in the figures may not be drawn to scale.

DETAILED DESCRIPTION

In embodiments of the invention, a dielectric structure is formed on a semiconductor substrate. The dielectric structure may be, for example, a line in a dielectric pattern, or a discrete body of dielectric material. After the dielectric structure is formed, a portion of an electrically conducting region disposed to a side of the dielectric structure is etched with an etchant to remove any contaminants at the electrically conducting region. Contaminants can be disposed on the surface of the electrically conducting region or may be partially embedded within the electrically conducting region. In some processes, the contaminants are disposed at the electrically conducting regions as discrete contaminants, as opposed to a complete film of material. After etching, the etched electrically conducting region is substantially free of contaminants. The resulting etched surface of the electrically conducting region has known surface conductivity properties. When a conductive material is subsequently deposited on the etched electrically conducting region, a reliable electrical connection is formed between the etched electrically conducting region and the deposited conductive material.

Specific embodiments of the invention can be described with reference to FIGS. 2 to 7. FIGS. 2 to 7 show cross-sections of semiconductor substrates being processed to form a semiconductor substrate with trench MOSFET devices and Schottky diodes. Additional processing details for trench MOSFET devices of the type shown in FIGS. 2 to 7 are in commonly-assigned U.S. patent application Ser. No. 08/1970,221, entitled "Field Effect Transistor and Method of its Manufacture," by Bencuya et al. Additional details regarding the formation integrated MOSFET DEVICES and Schottky diodes on semiconductor substrates are described in commonly-assigned U.S. patent application Ser. No. 09/267,92 now U.S. Pat. No. 6,351,018 entitled "Monolithically Integrated Trenched Gate MOSFET and Schottky diode", by Steven Sapp. Both of these U.S. patent applications are herein incorporated by reference in their entirety for all purposes.

Figure 1:
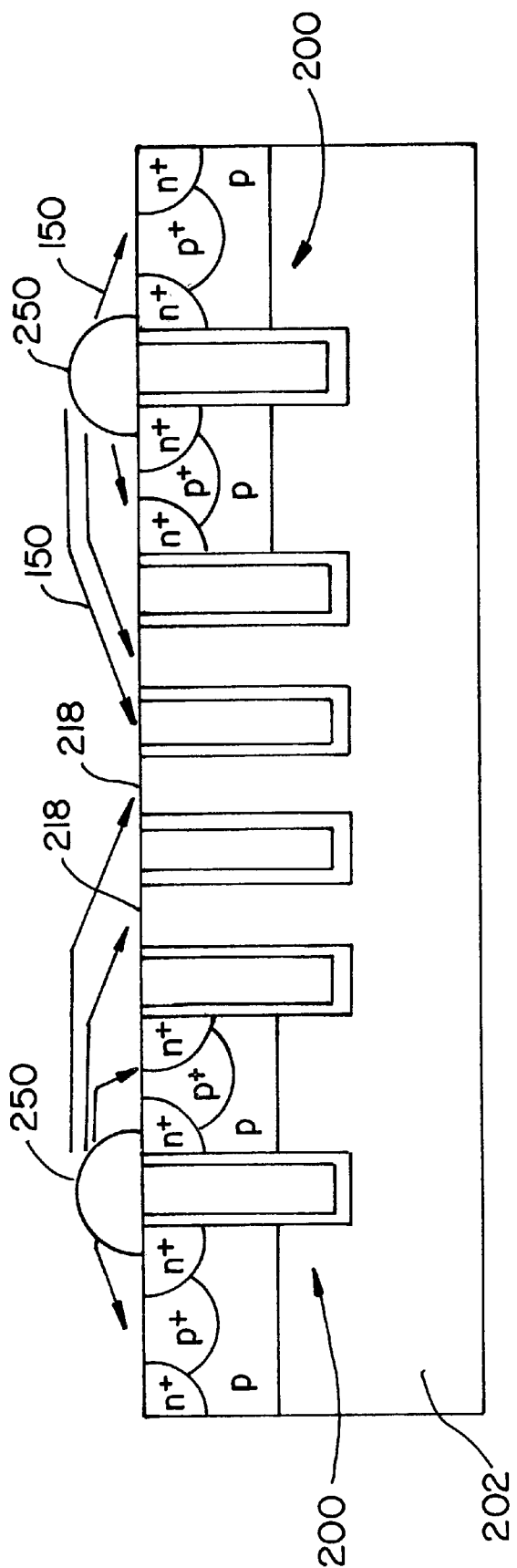
FIG. 1 shows a cross section of a semiconductor substrate having MOSFET devices and dielectric structures that are reflowed. Contaminants pass out of the reflowed dielectric structures and deposit on the semiconductor substrate.
Figure 2:
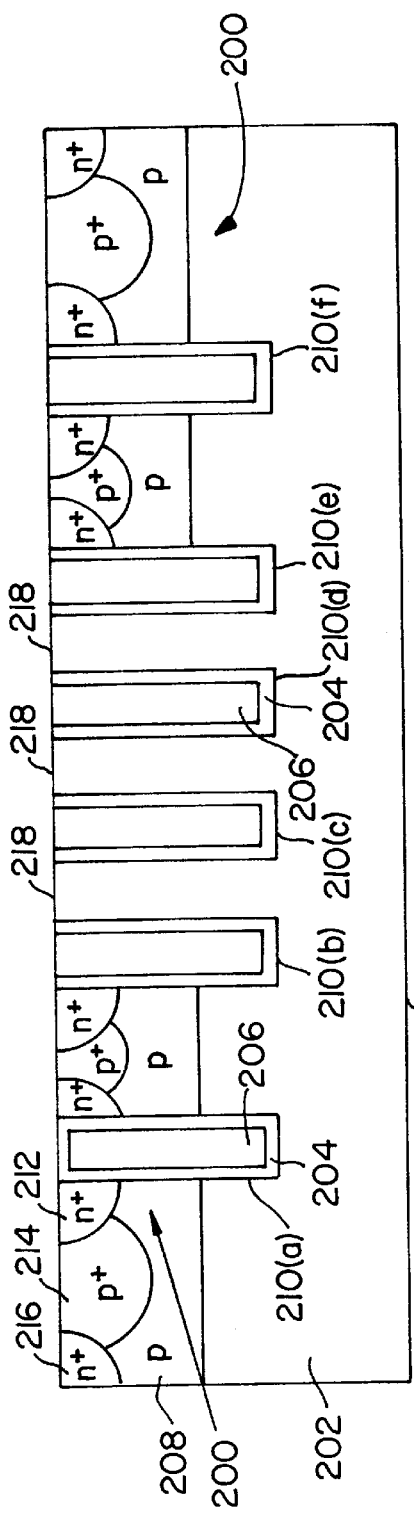
FIGS. 2 to 7 show cross-sections of semiconductor substrates during various processing steps used in embodiments of the invention.

FIG. 2 shows a cross-sectional view of a simplified example of a semiconductor substrate 202 (e.g., a silicon substrate) having a plurality of trench structures 210(a)–210(f) and MOSFET devices 200. Some of the trench structures 210(a), 210(f) are filled with a thin dielectric layer 204 and a conductive material 206 such as polysilicon that forms a gate electrode for the MOSFET devices 200. In case of an N-channel transistor, MOSFET device 200 includes an N+ source region 212 and a drain region 215.

Electrically conducting regions 218 are disposed between some of the trench structures 210(b)–210(e) and may include the upper parts of mesa structures formed by adjacent trench structures 210(b)–210(e). The upper surfaces of the electrically conducting regions 218 may also coincide with the upper surface of the semiconductor substrate 202. As will be explained in further detail below, in subsequent processing, a Schottky metal (not shown) may be deposited on each of the electrically conducting regions 218 to form a Schottky diode.

In the exemplary embodiment shown in FIG. 2, the electrically conducting regions 218 comprise a semiconducting material such as silicon. However, in embodiments of the invention, the electrically conducting regions may comprise any suitable region that exhibits electrical conductivity. For example, the electrically conducting regions may comprise a doped or undoped semiconducting material. Examples of semiconducting materials may include silicon or gallium arsenide. The electrically conducting region may also comprise a metallic material. Examples of metallic materials include copper, aluminum, nickel, titanium, tungsten, and alloys thereof. In some embodiments, the electrically conducting region may be, for example, a barrier layer for a Schottky diode or a contact metal layer on a source region of a MOSFET. The barrier layer or the contact metal layer can be etched to remove any contaminants at these layers. Another conductive material such as a metal for a source metal layer may then be deposited on the etched barrier layer or etched contact metal layer.

In some embodiments, the electrically conducting regions form part of the semiconductor substrate. In one example, the source region of a FET may constitute an electrically conducting region. In another example, an electrically conducting region may be an upper part of a mesa formed by adjacent trench structures in a semiconductor substrate. The top of the mesa can be etched to remove a portion of the upper part of the mesa along with any contaminants present at the top of the mesa.

In a typical process for forming the structure shown in FIG. 2, the plurality of trench structures 210(a)–210(f) are patterned and etched into the semiconductor substrate 202. The semiconductor substrate 202 may also comprise an n-type epitaxial upper layer (not shown). Thin layers of dielectric material 204 (e.g., silicon dioxide) are formed along the walls of trench structures 210(a)–210(f). Conductive material 206 such as polysilicon is then deposited to substantially fill each trench 210(a)–210(f). The conductive material 206 in the trench structures 210(a), 210(f) forms the gate electrodes for MOSFET devices 200. A p-type well 208 is then formed at the upper surface of the semiconductor substrate 202, except between those trench structures 210(b)–210(e) where a Schottky diode is to be formed. To accomplish this, the surfaces of the semiconductor substrate 202 between the trench structures 210(b)–210(e) may be masked during the p-well implant step. N+ source regions 212 are then formed inside the p-well regions 208, either before or after forming p+ heavy body regions 214. The N+ source regions 212, the p-well regions, and the p+ heavy body regions 214 may be formed using conventional processes such as ion implantation or thermal diffusion.

Figure 3:
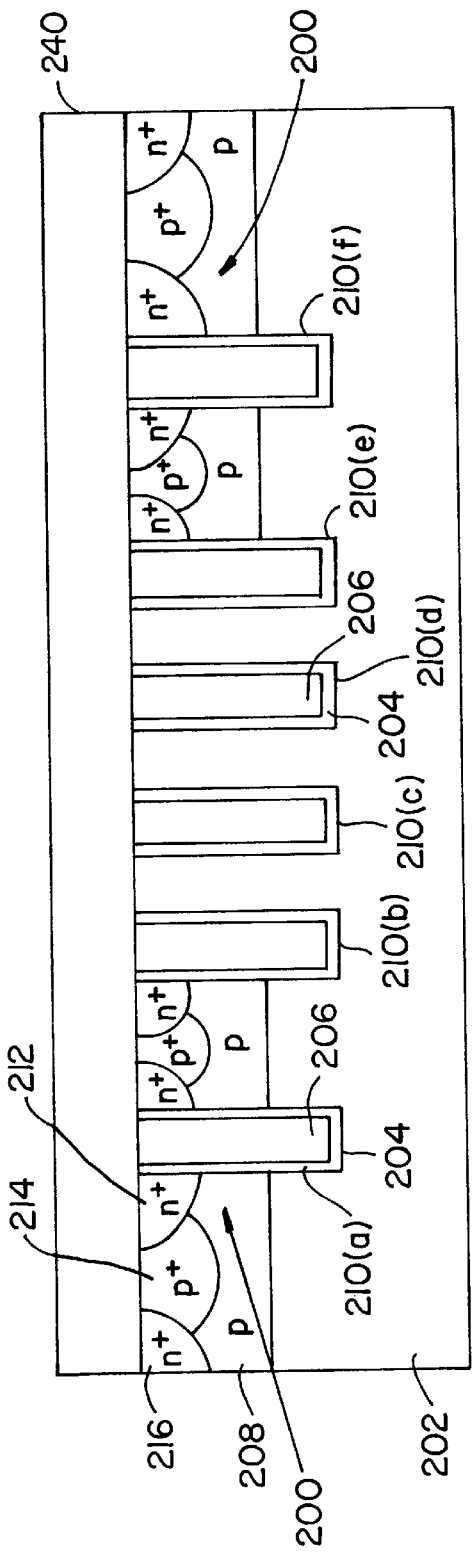

As shown in FIG. 3, after the MOSFET devices 200 are formed, a dielectric layer 240 is deposited on the semiconductor substrate 202. The dielectric layer 240 may be either selectively deposited or deposited as a continuous blanket layer that substantially covers the upper surface of the semiconductor substrate 202. Any suitable process may be used to deposit the dielectric layer 240. Exemplary processes include CVD (chemical vapor deposition), PECVD (plasma enhanced chemical vapor deposition), and PVD (physical vapor deposition).

The dielectric layer 240 may comprise any suitable dielectric material including silicon oxide, silicon nitride, and doped or undoped glass. Doped glass may include dopants such as boron, phosphorous, and fluorine. Exemplary doped glasses include borophosphosilicate glass (BPSG) and phosphosilicate glass (PSG). Doped glass is preferably used to form the dielectric structures, because its melting point can be made lower than that of regular glass or other dielectric materials. Many types of ordinary undoped glass do not melt until roughly 1400° C. Heating the semiconductor substrate at temperatures this high during the reflow process increases the likelihood that the high temperatures will damage FETs and other devices on the semiconductor substrate. In comparison, many doped glasses melt at temperatures less than about 1000° C. Since the reflow temperature for doped glass is less than the reflow temperature for a dielectric material such as undoped glass, the risk of device damage due to high heat is reduced.

Figure 4:
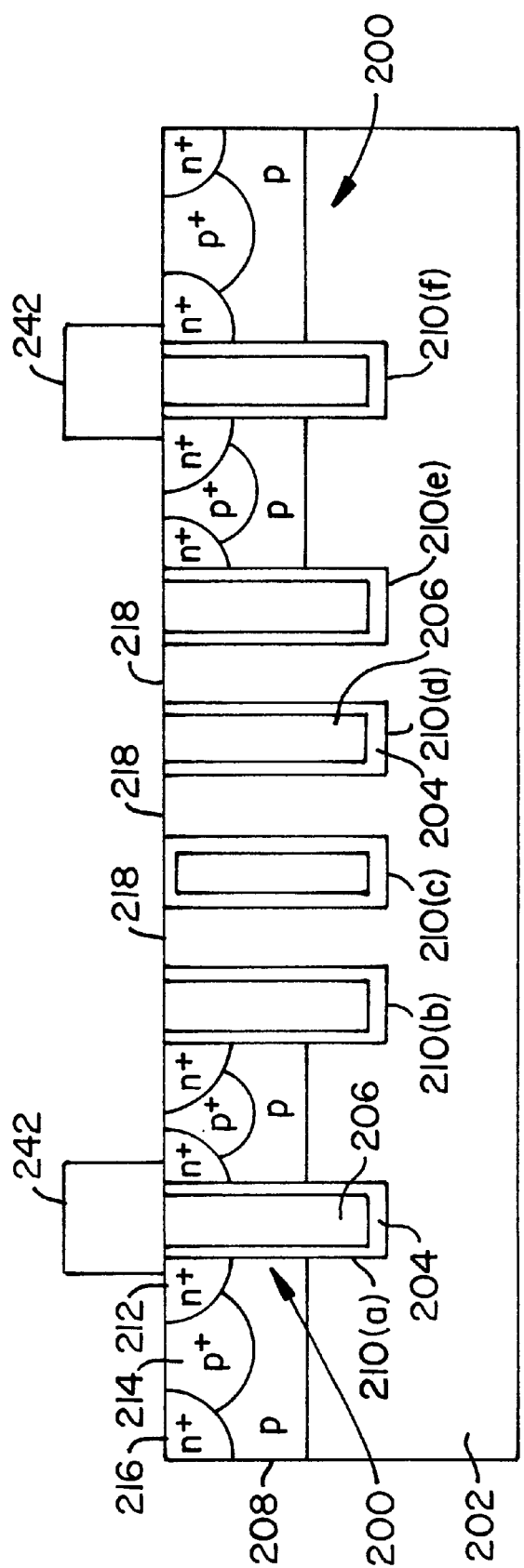

Referring to FIG. 4, a plurality of dielectric structures 242 may be formed from the previously deposited dielectric layer 240. The dielectric structures 242 are formed on some of the N+ source regions 212 as well as on the dielectric layers 204 and conductive material 206 within the trench structures 210(a), 210(f). The dielectric structures 242 electrically isolate the N+ source regions 212 and the conductive material 206 forming the gate electrodes of the MOSFET devices 200.

The dielectric structures 242 may be formed using conventional photolithography and etching processes. For example, photoresist can be deposited on the dielectric layer 240 (shown in FIG. 3) and can then be irradiated with a pattern of radiation. Depending upon whether the photoresist material is positive or negative, the irradiated or non-irradiated portions of the deposited photoresist material may be removed leaving a photoresist pattern on the dielectric layer 240. Then, the portions exposed through the photoresist pattern are etched with a suitable etchant leaving a dielectric pattern of dielectric structures 242 (shown in FIG. 4). After etching, the photoresist is stripped from the upper surfaces of the dielectric structures 242 in a stripping process. The pattern of dielectric structures 242 remain on the semiconductor substrate 202 after the photoresist is stripped. As noted above, in the stripping process, removed photoresist particles can deposit on the semiconductor substrate 202.

The process described above with reference to FIGS. 2 to 4 is a typical subtractive process where material is removed to form the dielectric structures 242. It is understood that in embodiments of the invention, any suitable conventional additive process could also form the dielectric structures 242. In a typical additive process, the dielectric structures 242 are formed by filling apertures in a photoresist pattern with a dielectric material.

Figure 5:
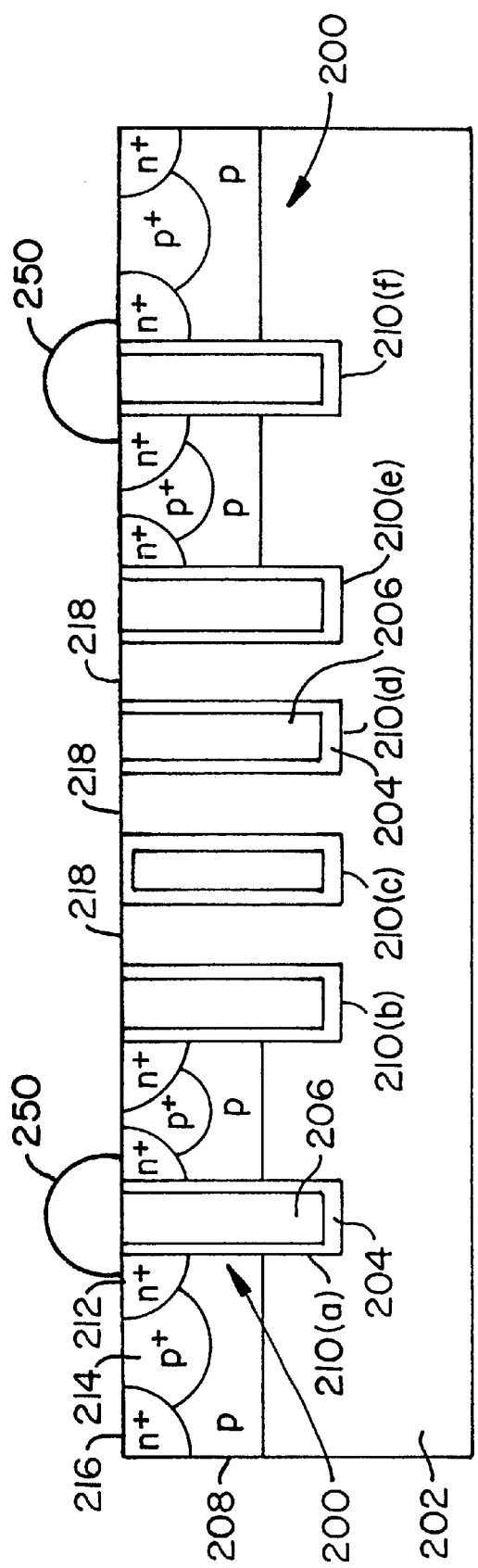

Referring to FIGS. 4 and 5, after the dielectric structures 242 are formed, the dielectric structures 242 may be reflowed. In a typical reflow process, the dielectric structures 242 are heated to a temperature greater than about 800° C. to partially melt the dielectric structures 242 to form reflowed dielectric structures 250. As the dielectric structures 242 melt, voids within the dielectric structures 242 are removed as the dielectric material coalesces together. The outer surfaces of the dielectric structures 242 become smoother as a result of reflowing. The smooth surfaces of the reflowed dielectric structures 250 permit a deposited conductive material to flow more easily on the surfaces of the reflowed dielectric structures 250. Areas between the dielectric structures 250 can be substantially filled with a conductive material, without forming voids in the deposited conductive material. Smoother dielectric structures simplify subsequent processing steps and improve the reliability of the resultant integrated circuit.

In an illustrative example, BPSG dielectric structures with relatively rough outer surfaces can be heated in a reflow process. The BPSG dielectric structures can be heated between about 800° C. to about 900° C. (or more) in an inert atmosphere. The low heating temperature minimizes potential thermal damage to the MOSFET devices on the semiconductor substrate. Heating the BPSG dielectric structures melts the BPSG and smoothes the outer surfaces of the dielectric structures. The smooth surfaces of the BPSG dielectric structures permit a conductive material to more easily fill spaces between the dielectric structures with conductive material.

After reflow process is completed, electrically conducting regions to the sides of the reflowed dielectric structures 250 are etched with a suitable etchant. The etching process may be anisotropic or isotropic, and may be a wet or a dry etch process. For a wet etch process, suitable wet etchants such as acidic solutions (e.g., nitric acid solutions) can be used. A dry etch process may alternatively be used to etch the electrically conducting regions. Examples of dry etch processes include sputter etching and ion beam milling, plasma etching (e.g., high-density plasma etching), and reactive ion etching. Plasma etch processes may be powered using RF (radio frequency) or microwave power to form an etching plasma. In a plasma process, gases (e.g., $CF_4$ and $O_2$) are typically ionized to etch the electrically conducting regions.

In an illustrative example of a plasma etch process, a Gasonics™ 2000 microwave plasma etching apparatus may be used to etch regions of a silicon substrate having a plurality of dielectric structures disposed on the silicon substrate. A 3:1 ratio of $CF_4:O_2$ can be introduced into a chamber in the apparatus and a plasma can be produced. The plasma process may run, for example, at a temperature of about 90° C. and at a pressure of about 2.5 Torr. A plasma is produced and etches the electrically conducting regions of silicon between the dielectric structures to remove contaminants at the electrically conducting regions without etching substantial portions of the dielectric structures.

The etching process normally takes place for a brief period of time. In a typical example, the etching may take place for less than about 1 minute (e.g., less than about 30 seconds). Of course, the etching time may vary depending upon the material being etched and the particular etchant used in the etching process.

The amount of material removed from the electrically conducting regions may vary. However, less than half of the thickness of the electrically conducting region is typically removed in the etching process. In some embodiments, less than 1000 Angstroms of material may be removed from an electrically conducting region in the etching process. For example, less than about 700 Angstroms of silicon may be removed in the etching process to provide a substantially pure silicon surface substantially free of contaminants.

Preferably, during the etching process, the etching of the reflowed dielectric structures 250 is minimized. By minimizing the etching of the reflowed dielectric structures 250, the likelihood that the dielectric structures 250 will be overetched and not cover the N+ source regions 212 is reduced. The electrically conducting regions 218 can be etched to any desired depth to remove contaminants such as embedded contaminants without impacting the formed dielectric structures 250.

In some embodiments of the invention, to minimize the etching of the reflowed dielectric structures, the etchant used in the etching process selectively etches the electrically conducting regions at a faster rate than the dielectric structures. For example, an etchant formed from a gaseous mixture comprising $CF_4$ and $O_2$ etches silicon faster than silicon dioxide or glass (e.g., doped glass). An etch process that preferentially etches silicon faster than another material such as silicon oxide or BPSG can be referred to as a "silicon etch process". Examples of wet etchants suitable for a silicon etch process include $HNO_3:H_2O:HF$ (+$CH_3COOH$) (50:20:1) and $KOH:H_2O:IPA$ (23 wt. % KOH, 13 wt. % IPA-isopropyl alcohol). Examples of dry etchants suitable for a silicon etch process include $SF_6$, $CF_4$, $CF_4/H2$, $CHF_3$, $CF_4/O_2$, HBr, $Cl_2$, and $Cl_2HBr/O_2$. In other embodiments of the invention, the reflowed dielectric structures could be masked (e.g., with photoresist) while an etchant etches uncovered electrically conducting regions.

Figure 6:
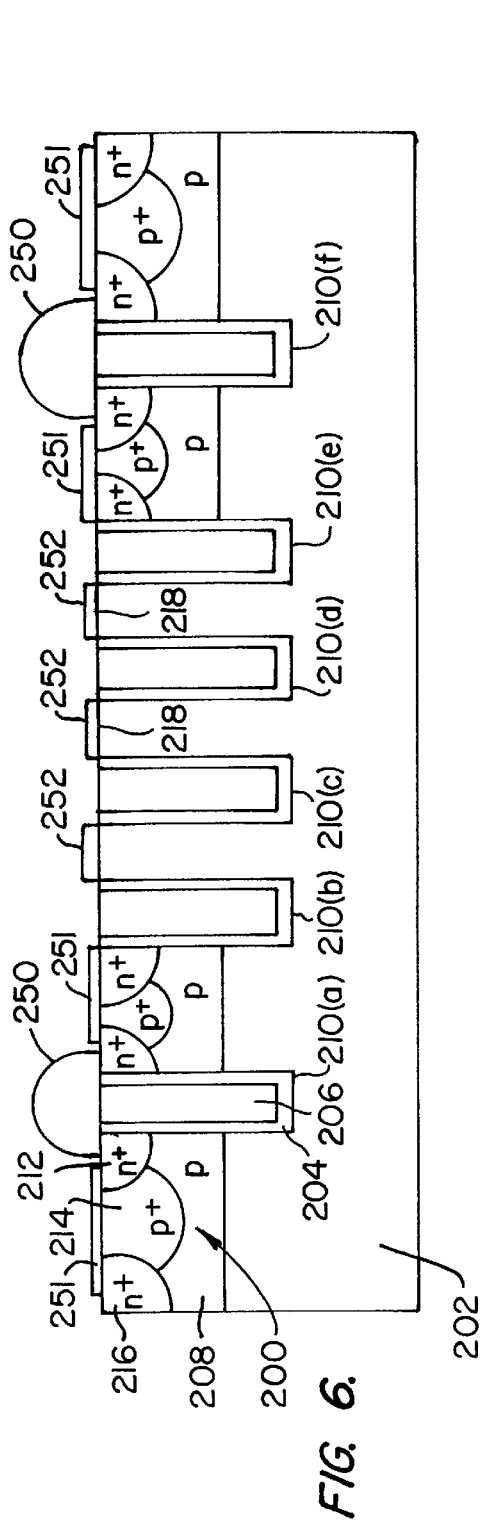

After the electrically conducting regions are etched, a conductive material is deposited on the etched regions. The conductive material is preferably a Schottky metal. When a Schottky metal contacts a semiconducting material, a Schottky diode is formed. The Schottky metal may be in the form of a barrier layer, which may in turn support an overlying metal layer such as a source metal layer. For example, with reference to FIG. 6, barrier layers 252 may be formed on the etched electrically conducting regions 218. Metals that can be used in the barrier layer may include titanium, nickel, tungsten, and combinations thereof. The deposited conductive material could also be a contact metal that forms an ohmic contact with other etched electrically conducting regions. For example, as shown in FIG. 6, source contacts 251 comprising a contact metal such as titanium tungsten (TiW) or titanium nitride (TiNi) layers may be patterned and deposited on the surface of the semiconductor substrate 202 to make contact to the N+ source regions 212.

Figure 7:
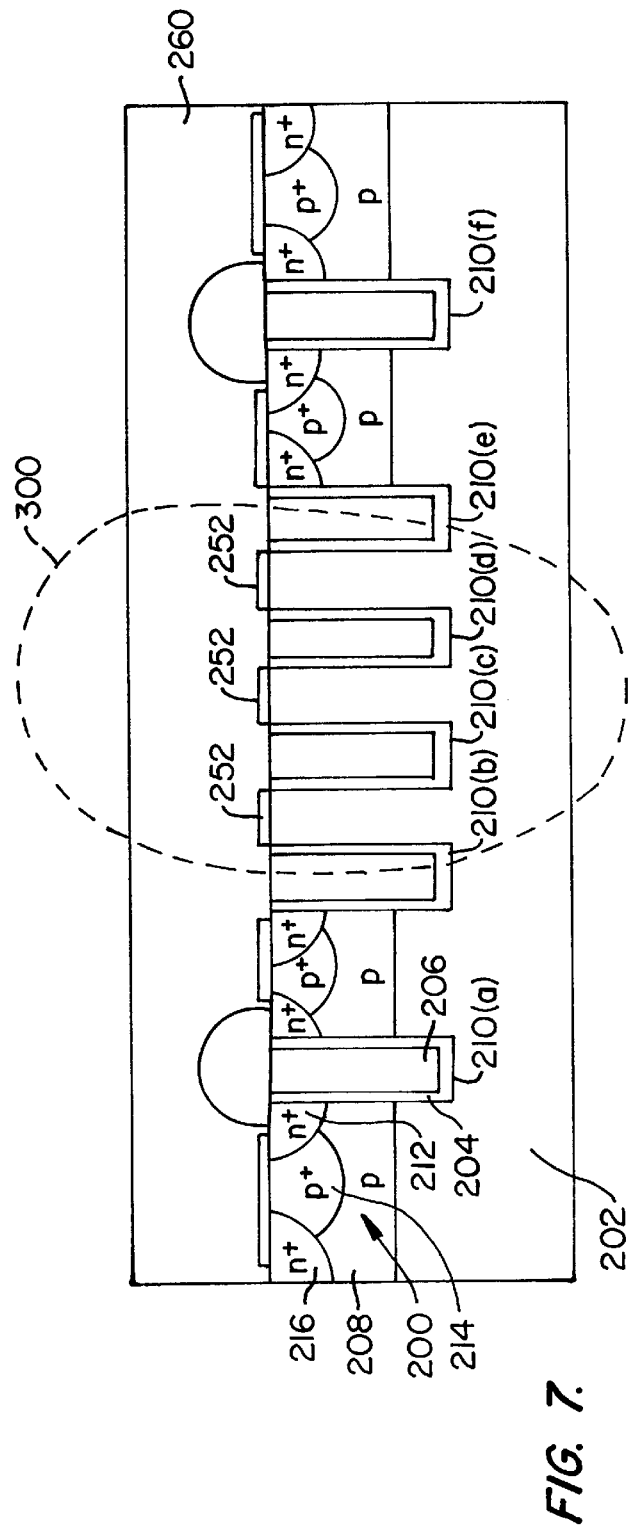

Referring to FIG. 7, an overlying metal layer 260 may then be deposited over the reflowed dielectric structures 250 the barrier layers 252, and the source contacts 251. The overlying metal layer 260 electrically couples the source contacts 251 and the barrier layers 252. Metals such as aluminum or copper may be included in the overlying metal layer 260.

The resulting structure, as shown in FIG. 7, includes a Schottky diode 300 between trench MOSFET devices 200. The N-type semiconductor substrate 202 forms the cathode terminal of the Schottky diode 300 as well as the drain terminal of the trench MOSFET devices. The barrier layers 252 may serve as the anode terminal for the Schottky diode 300.

Although Schottky diodes and trench MOSFET devices are described in detail, it is understood that the invention is not limited thereto. For example, embodiments of the invention can also be used in the processing of planar MOSFET devices. In another example, although the fabrication of both Schottky diodes and MOSFETs are discussed in detail, embodiments of the invention can be used to produce one or more Schottky diodes on a semiconductor substrate without forming MOSFET devices. Embodiments of the invention of the invention can be used to form any suitable electrical device or device precursor (e.g., preliminary layers forming a device) for integrated circuits where the presence of contaminants can affect the operation of a device.

Embodiments of the invention provide a number of advantages. For example, in embodiments of the invention, contaminants that might alter the conductivity of an electrically conducting region can be effectively removed. As a result, the electrically conducting region can have known conductive properties (e.g., a known surface resistivity) so that devices such as Schottky diodes and MOSFETs can be reliably formed.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method for removing contaminants on a semiconductor substrate, the method comprising:
   (a) forming a dielectric structure on the semiconductor substrate;
   (b) etching a portion of an electrically conducting region disposed to a side of the dielectric structure, wherein the electrically conducting region is etched at a faster rate than the dielectric structure; and
   (c) depositing a conductive material on the etched electrically conducting region, and wherein the method further comprises
       reflowing the dielectric structure prior to etching the portion of the electrically conducting region.

2. The method of claim 1 wherein the dielectric structure comprises at least one selected from the group consisting of phosphorous and boron.

3. The method of claim 1 wherein forming the dielectric structure comprises:
   depositing a dielectric layer on the semiconductor substrate;
   forming a photoresist pattern on the continuous dielectric layer; and
   etching the dielectric layer in areas exposed through the photoresist pattern.

4. The method of claim 1 further comprising:
   forming a plurality of devices or device precursors on the semiconductor substrate.

5. The method of claim 1 wherein the dielectric structure comprises borophosphosilicate glass.

6. The method of claim 1 wherein the conductive material forms a barrier layer for a Schottky diode.

7. The method of claim 1 wherein etching comprises dry etching.

8. The method of claim 1 wherein etching comprises wet etching.

9. The method of claim 1 wherein etching comprises using a silicon etch process.

10. The method of claim 1 wherein the electrically conducting region comprises a semiconductor material.

11. The method of claim 1 wherein the electrically conducting region comprises silicon.

12. The method of claim 1 further comprising:
    forming a plurality of devices or device precursors on the semiconductor substrate, wherein the plurality of devices or device precursors comprises a trench MOSFET.

13. The method of claim 1 further comprising:
    forming a plurality of devices or device precursors on the semiconductor substrate, wherein the plurality of devices or device precursors comprises a MOSFET and a Schottky diode.

14. The method of claim 1 wherein etching comprising using an etchant comprising $CF_4$ and $O_2$.

15. The method of claim 1 wherein etching comprises etching less than about 1000 Angstroms of the electrically conducting region.

16. A method for removing surface contamination on a semiconductor substrate, the method comprising:

(a) forming a field effect transistor on a semiconductor substrate, wherein the field effect transistor has a gate electrode, a source region, and a drain region;

(b) forming a dielectric structure on the gate electrode and the source region;

(c) reflowing the dielectric structure;

(d) etching a portion of the electrically conducting region disposed to a side of the reflowed dielectric structure, wherein the electrically conducting region is etched at a faster rate than the dielectric structure;

(e) forming a barrier layer for a Schottky diode on the etched electrically conducting region; and (f) depositing a conductive layer on the barrier layer.

17. The method of claim 16 wherein etching comprises using a silicon etch process.

18. The method of claim 16 wherein the field effect transistor is a MOSFET.

19. The method of claim 16 wherein the dielectric structure on the gate electrode comprises phosphorous or boron.

20. The method of claim 16 wherein the field effect transistor is a trench MOSFET.

21. The method of claim 16 wherein etching comprises using a plasma etch process.

22. The method of claim 16 further comprising:

forming a source contact on the source region, and wherein the conductive layer is electrically coupled to the source contact.

* * * * *